(12) United States Patent
Murase et al.

(10) Patent No.: US 7,859,348 B2
(45) Date of Patent: Dec. 28, 2010

(54) CRYSTAL DEVICE FOR SURFACE MOUNTING

(75) Inventors: Shigeyoshi Murase, Sayama (JP); Chisato Ishimaru, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 107 days.

(21) Appl. No.: 12/384,515

(22) Filed: Apr. 6, 2009

(65) Prior Publication Data

US 2009/0261913 A1 Oct. 22, 2009

(30) Foreign Application Priority Data

Apr. 16, 2008 (JP) ............................. 2008-107108

(51) Int. Cl.
*H01L 41/053* (2006.01)
*H03B 1/00* (2006.01)

(52) U.S. Cl. .................. 331/68; 331/158; 310/340; 310/344

(58) Field of Classification Search .................. 331/68, 331/69, 158; 310/311, 340, 341, 344, 348
See application file for complete search history.

(56) References Cited

U.S. PATENT DOCUMENTS 6,777,858 B2 * 8/2004 Bang et al. .................. 310/348

FOREIGN PATENT DOCUMENTS

| JP | 2002231845 A | * | 8/2002 |
|---|---|---|---|
| JP | 2003-068900 A | | 3/2003 |
| JP | 2004-063960 A | | 2/2004 |
| JP | 2007-075857 | | 3/2007 |
| JP | 2007073713 A | * | 3/2007 |
| JP | 2007142186 A | * | 6/2007 |
| JP | 2007-173976 | | 7/2007 |
| JP | 2009-224515 A | | 10/2009 |

* cited by examiner

*Primary Examiner*—Robert Pascal
*Assistant Examiner*—Ryan Johnson
(74) *Attorney, Agent, or Firm*—Carrier Blackman & Associates, P.C.; William D. Blackman; Joseph P. Carrier

(57) ABSTRACT

A crystal device for surface mounting, in which a metal cover is jointed to the metal ring by seam welding, satisfies relationships $A2/A1 < C2/C1$ and $B2/B1 < D2/D1$, where A1 is a length of a long side of the metal ring, A2 is a length of a straight portion of a long side except for curved portions, B1 is a length of a short side of the metal ring, B2 is a length of a straight portion of the short side except for the curved portions thereof, C1 is a length of a long side of the metal cover, C2 is a length of a straight portion of the long side except for the curved portions thereof, D1 is a length of a short side of the metal cover, and D2 is a length of a straight portion of the short side except for the curved portions thereof.

2 Claims, 8 Drawing Sheets

CRYSTAL DEVICE FOR SURFACE MOUNTING

This application claims priority from Japanese Patent Application No. 2008-107108 filed on Apr. 16, 2008, the entire subject matter of which is incorporated herein by reference.

BACKGROUND OF THE INVENTION

1. Field of the Invention

The invention relates to a technical field of a crystal device for surface mounting which is appropriate for miniaturization, and in particular, to a crystal device hermetically encapsulating a crystal element therein by seam welding.

2. Description of the Related Art

A crystal device for surface mounting such as a crystal unit, a crystal oscillator, or a crystal filter is known as a frequency control element. For example, a crystal unit for surface mounting (hereinafter, referred to as a surface-mounted unit) is integrated into an oscillator circuit, to be built into various types of electronics as a source of frequency or as a time reference. In recent years, the miniaturization thereof has been further advanced, which has brought about their planar outlines which are 2.0×1.6 mm or less, for example.

Figure 6A:
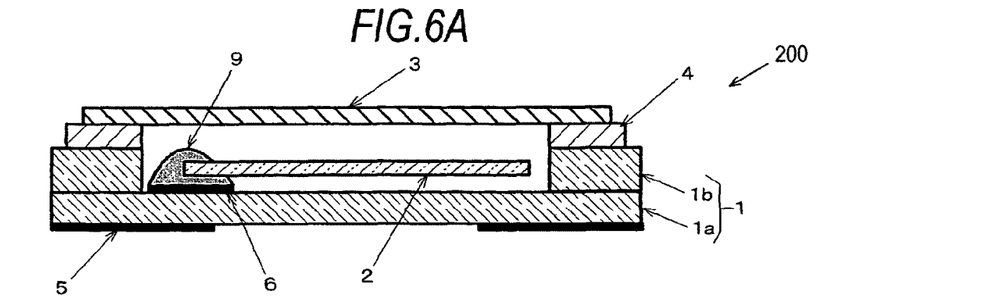
FIG. 6A is a cross-sectional view of the related art surface-mounted unit.
Figure 6B:
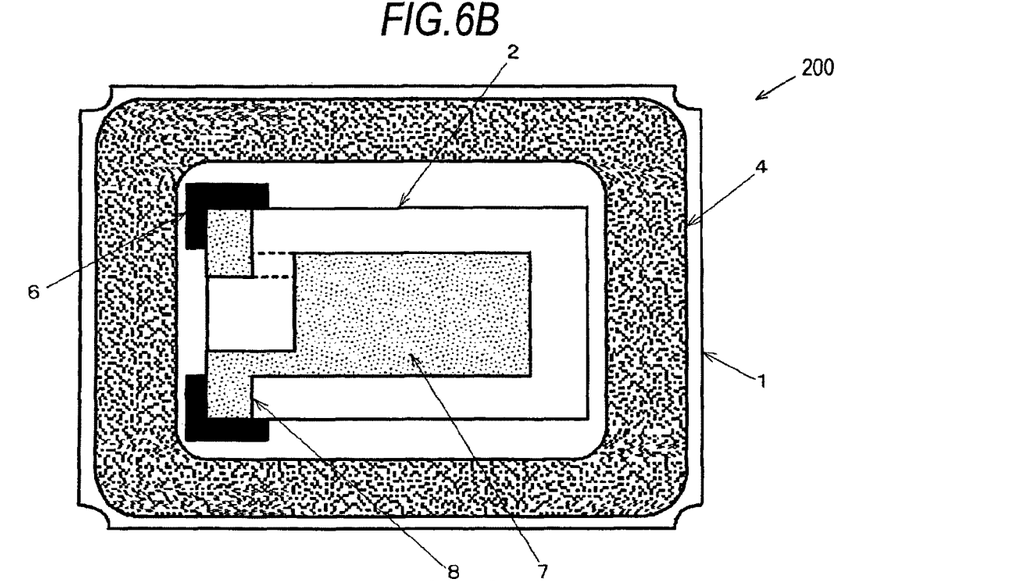
FIG. 6B is a plan view of the related art surface-mounted unit without a metal cover.
Figure 6C:
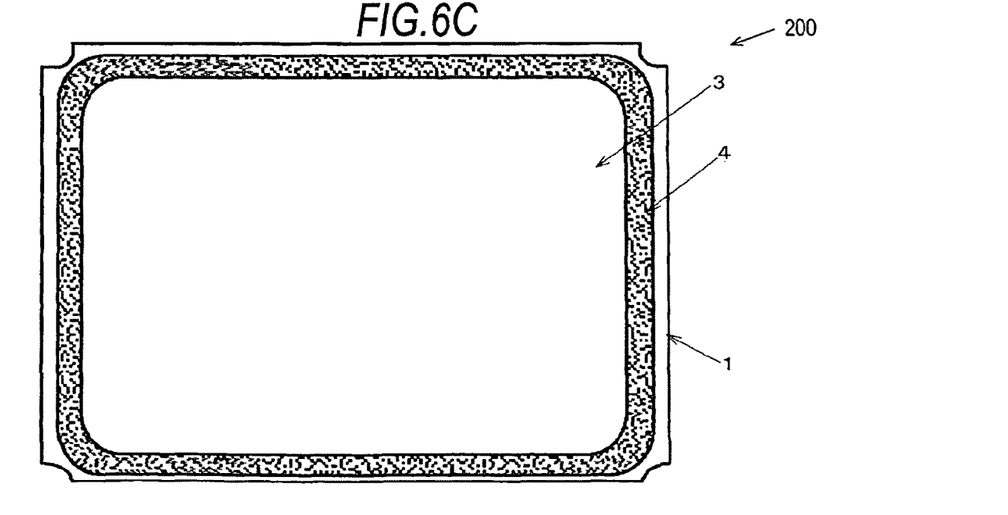
FIG. 6C is a plan view of the related art surface-mounted unit to which a metal cover is jointed.

FIGS. 6A to 6C are diagrams for explanation of one example of a related art surface-mounted unit. FIG. 6A is a cross-sectional view of the related art surface-mounted unit, FIG. 6B is a plan view of the related art surface-mounted unit without a metal cover, and FIG. 6C is a plan view of the related art surface-mounted unit to which the metal cover is jointed.

The related art surface-mounted unit 200 is configured such that a crystal element 2 is housed in a ceramic case 1 in a rectangular form whose cross section is formed to be concave, and a metal cover 3 is jointed by seam welding to hermetically encapsulate the crystal element 2. The ceramic case 1 is composed of a bottom wall 1a and a frame wall 1b, and a metal ring 4 is fixed to the upper surface of the frame wall 1b serving as an end face of the opening by, for example, silver solder (not shown) (see, for example, JP-A-2007-173976)

In this case, the outline of the metal ring 4 is made smaller than the outline of the ceramic case 1, to prevent the metal ring 4 from protruding from the end face of the opening of the ceramic case 1. Then, the outer circumference four corners of the metal ring 4 are formed into arc forms (curved portions) with a radius of curvature r1, for example. The outer circumference four corners of the metal ring 4 are provided so as to avoid through holes for dividing a ceramic sheet provided at outer circumference four corners of the ceramic case 1. The inner circumference of the metal ring 4 is matched to the inner circumference of the frame wall 1b of the ceramic case 1.

Then, external terminals 5 are provided to the four corners of the outer bottom face of the ceramic case 1 (bottom wall 1a) and crystal holding terminals 6 are provided to the both sides of one end of the inner bottom face. A pair of the external terminals 5 obliquely facing each other at the four corners of 5 the outer bottom face is electrically connected to the crystal holding terminals 6 on the inner bottom face through a lamination plane and unillustrated through holes (electrode through holes). The other pair of the external terminals 5 obliquely facing each other is connected to the metal ring 4 through electrode through holes and the like.

The crystal element 2 has excitation electrodes 7 on both principal surfaces thereof and leading electrodes 8 extended from the excitation electrodes 7 on the both sides of one end thereof. The extended both sides of the one end of the leading electrodes 8 are fixed to the crystal holding terminals 6 by an electrically conductive adhesive 9, and the both are electrically and mechanically connected.

The metal cover 3 is formed into a similar shape to the outline of the metal ring 4, for example, and has arc-formed curved portions with a radius of curvature r2 (=r1) at its outer circumference four corners. Thereby, a ratio A2/A1 between a length A1 of a long side of the metal ring 4 and a length A2 of a straight portion of along side except for the curved portions of the outer circumference four corners thereof, and a ratio C2/C1 between a length C1 of a long side of the metal cover 3 and a length C2 of a straight portion of the long side except for curved portions of the outer circumference four corners thereof become the same.

Further, a ratio B2/B1 between a length B1 of a short side of the metal ring 4 and a length B2 of a straight portion of the short side except for curved portions of the outer circumference four corners thereof, and a ratio D2/D1 between a length D1 of a short side of the metal cover 3 and a length D2 of a straight portion of the short side except for curved portions of the outer circumference four corners thereof as well become the same. Incidentally, by setting the radius of curvature r2 of the outer circumference four corners of the metal cover 3 equal to the radius of curvature r1 of the outer circumference four corners of the metal cover 4, even when the metal cover 3 is displaced front and back and side to side from the metal ring 4, for example, the outer circumference four corners of the metal cover 3 can be prevented from protruding.

Seam welding energizes between the pair of roller electrodes while making a pair of roller electrodes (not shown) contact the one end side of a set of sides facing each other of the metal cover 3 to press those to rotate so as to travel to the other end side. Thereby, an Ni (nickel) film on the outer circumferential surface of the metal cover 3 is fused by Joule heat so as to be jointed-to the metal ring 4. Then, after the set of the sides facing each other of the metal cover 3 are jointed to the metal ring 4 the other set of sides facing each other are jointed thereto in the same way (see, for example, JP-A-2007-75857).

However, in the related art surface-mounted unit 200 having the above-described configuration, since the arc-formed curved portions preventing the metal cover 3 from protruding from the metal ring 4 are provided to the outer circumference four corners of the metal cover 3, there is a problem that airtight loss is caused depending on welding conditions for performing seam welding of the metal cover 3 onto the metal ring 4.

Figure 7A:
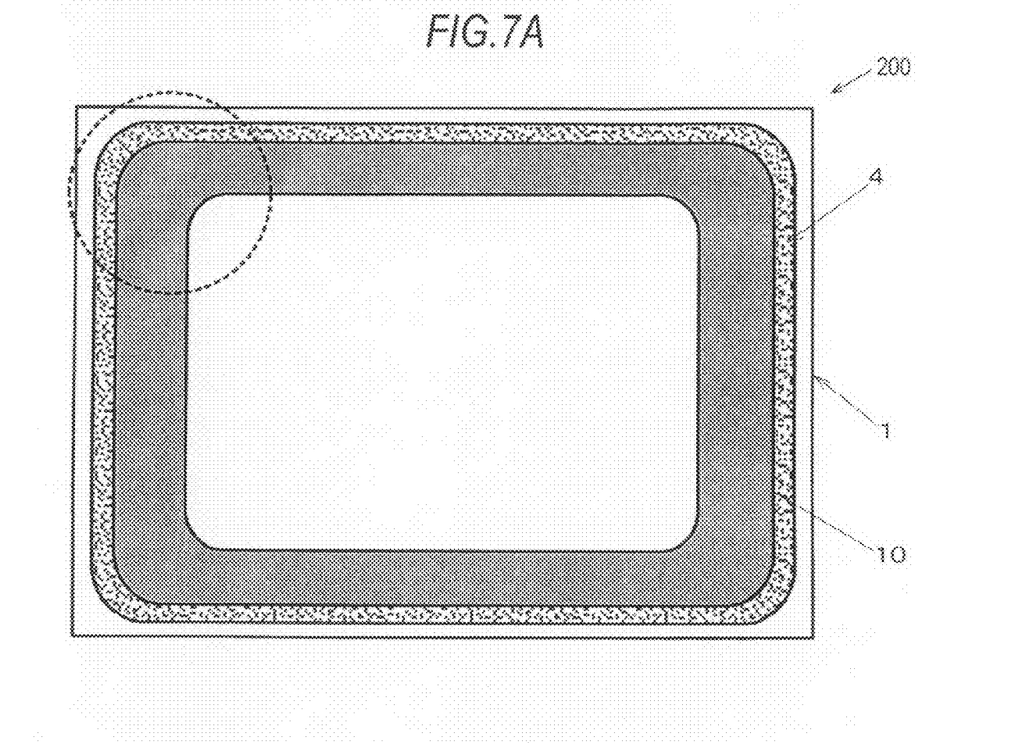
FIG. 7A is a plan view of the related art surface-mounted unit from which a metal cover is stripped off after the seam welding.

For example, when a speed of the electrode rollers in seam welding is kept constant, and an electric current value is strictly limited, as shown in FIG. 7A, the Ni film 10 on the surface of the metal cover 3 is sufficiently fused even on its straight portions and curved portions of the outer circumference four corners to be jointed to the metal ring 4. Incidentally, FIG. 7A is a plan view (view of end face of the opening) of the ceramic case 1 from which the metal cover 3 is stripped off after the seam welding.

In this case, the Ni film 10 of the contact face on the outer circumference of the metal cover 3 with respect to the metal ring 4 is fused to be jointed to the metal ring 4. Accordingly, the contact face between the metal ring 4 and the metal cover 3 basically becomes a sealing path. Incidentally, the metal ring 4 is formed by press working, and an inclined surface is formed on its inner circumferential surface, which generates unjointed areas of the inner circumference of the surface of the metal ring 4. The areas are omitted in the drawing.

Figure 7B:
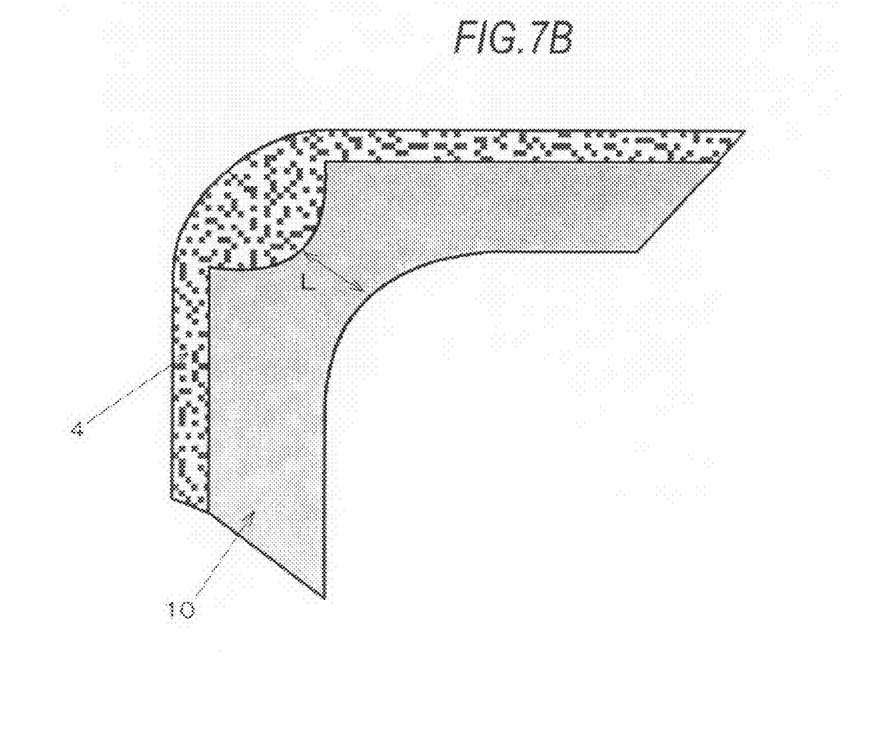
FIG. 7B is an enlarged view of a part shown by O-shaped dotted line in FIG. 7A.

In contrast thereto, if an allowable range for electric current value is expanded to relax limits thereon, as shown in FIG. 7B which is an enlarged view of a part shown by O-shaped dotted line in FIG. 7A, fusion of the Ni film on the curved portions of the outer circumference four corners is insufficient to cause poor jointing, which shortens a sealing path L. Then, if the sealing path is shortened, for example, its joint strength as well is reduced, which causes airtight loss by impact or the like.

In this case, since the electrode rollers in seam welding travel on straight lines along one set and the other set of respective sides facing each other, the contact between the electrode rollers and the metal cover 3 in the curved portions of the outer circumference four corners may be lost. The principal cause for this is because an electric current is not sufficiently supplied by the contact lost. Then, there is a current fluctuation or the like and a change in speed of the electrode rollers in reality even if an electric current value is strictly limited. Thus, poor jointing may be increased, and productivity of the surface-mounted unit may be degraded.

These problems become particularly prominent because the smaller the surface-mounted unit is made, for example, as the planar outline thereof comes to be 2.0×1.6 mm or less described above, the narrower the width of the metal ring 4 is made, which shortens a sealing path-L (a joint width with the metal cover 3) to limit its welding conditions.

SUMMARY OF THE INVENTION

An object of the invention is to provide a crystal device in which jointing on outer circumference four corners thereof is sufficiently performed to ensure sealing paths, so as to reliably retain its airtightness and improve productivity thereof.

According to a first aspect of the invention, there is provided a crystal device for surface mounting that is configured such that: at least a crystal element is housed in a ceramic case, which has a rectangular shape in a plan view, and which cross section including a bottom wall and a frame wall is formed to be concave; and a metal cover, which is smaller than an outline of a metal ring, and outer circumference four corners of which are formed into arc-formed curved portions with a radius of curvature r2, is jointed to the metal ring, which is provided to an end face of an opening of the ceramic case, and outer circumference four corners of which are formed into arc-formed curved portions with a radius of curvature r1, by seam welding, wherein the crystal device for surface mounting satisfies relationships $A2/A1 < C2/C1$ and $B2/B1 < D2/D1$, where a ratio between a length $A1$ of a long side of the metal ring and a length $A2$ of a straight portion of the long side except for the curved portions of the outer circumference four corners of the metal ring is $A2/A1$, and a ratio between a length $B1$ of a short side of the metal ring and a length $B2$ of a straight portion of the short side except for the curved portions of the outer circumference four corners of the metal ring is $B2/B1$, and where a ratio between a length $C1$ of a long side of the metal cover and a length $C2$ of a straight portion of the long side except for the curved portions of the outer circumference four corners of the metal cover is $C2/C1$, and a ratio between a length $D1$ of a short side of the metal cover and a length $D2$ of a straight portion of the short side except for the curved portions of the outer circumference four corners of the metal cover is $D2/D1$.

According to a second aspect of the invention, in the crystal device for surface mounting, wherein the radius of curvature r2 of the outer circumference four corners of the metal cover is smaller than the radius of curvature r1 of the outer circumference four corners of the metal ring.

According to the first aspect of the invention, the length of the straight portions except for the outer circumference four corners of a long side and a short side are made longer than those in the related art. Therefore, the welding efficiency on the outer circumference four corners can be increased to make the joint sufficient, and sealing paths on the outer circumference four corners can be ensured. Further, an allowable range for an electric current value in seam welding can be also increased, and thus productivity of the crystal device can be improved.

According to the second aspect of the invention, since the leading ends of the outer circumference four corners of the metal cover further protrude toward the metal ring more than the related art, it is possible to ensure sealing paths thereof even if there are portions in poor jointing (unfused portions).

BRIEF DESCRIPTION OF THE DRAWINGS

FIGS. 1A to 1C are diagrams of a surface-mounted unit for explanation of one embodiment of the invention, in which

FIGS. 2A and 2B are diagrams of the surface-mounted unit, in which

FIGS. 6A to 6C are diagrams for explanation of a related art surface-mounted unit, in which FIGS. 7A and 7B are schematic views of the related art surface-mounted unit, in which

DETAILED DESCRIPTION OF THE PREFERRED EMBODIMENTS

Figure 1A:
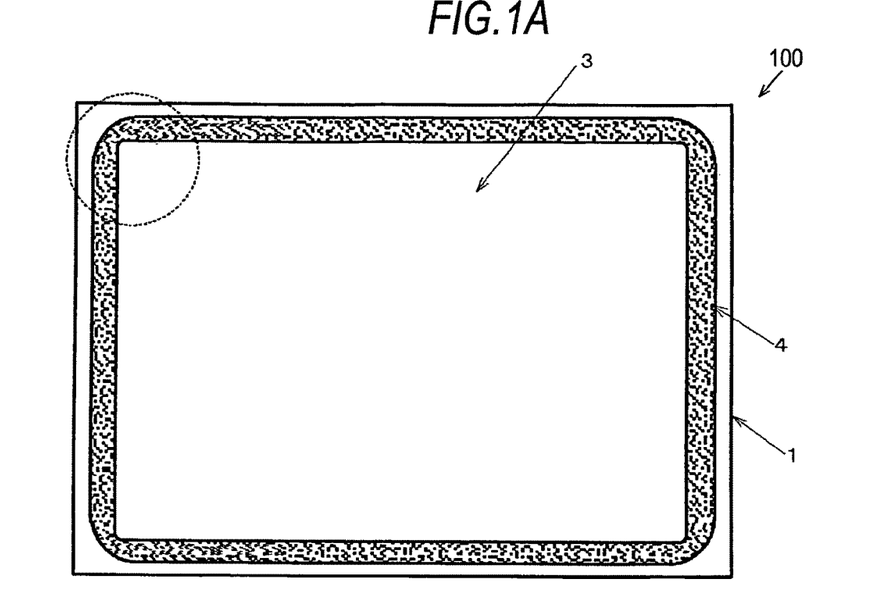
FIG. 1A is a plan view of the surface-mounted unit to which a metal cover is jointed.
Figure 1B:
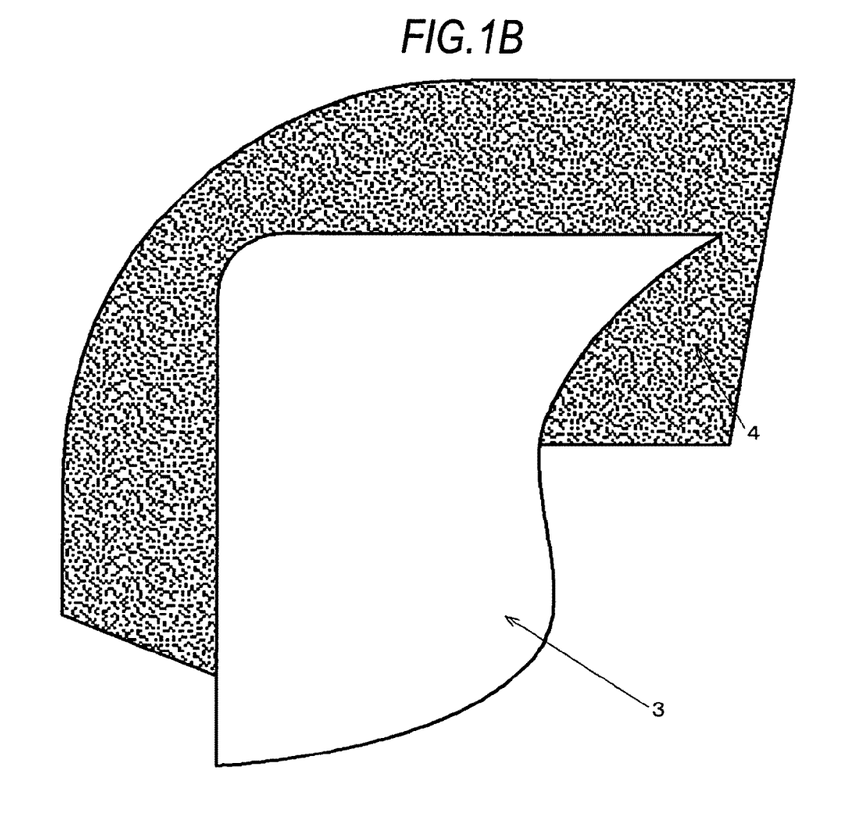
FIG. 1B is an enlarged view of a part shown by O-shaped dotted line in FIG. 1A.
Figure 1C:
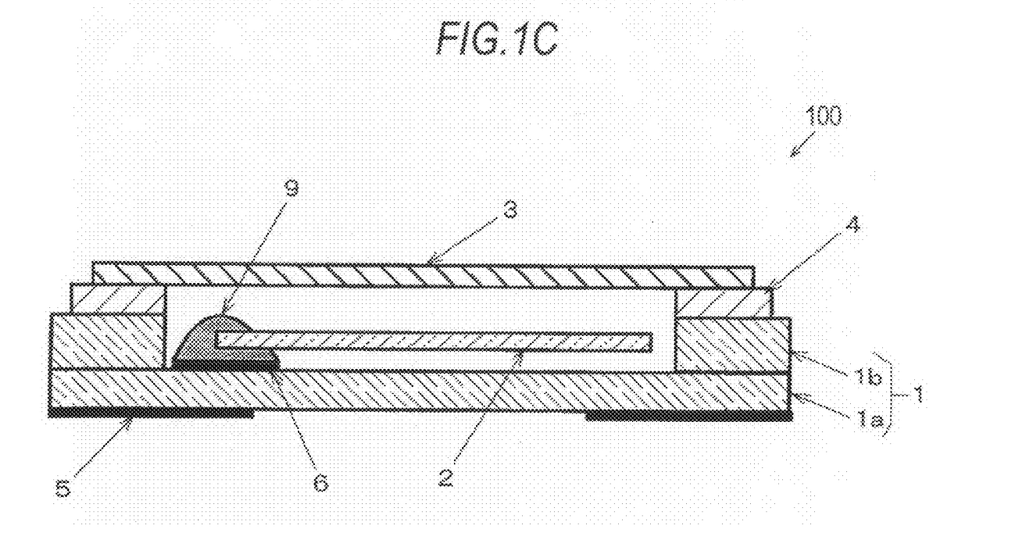
FIG. 1C is a cross-sectional view of the surface-mounted unit.
Figure 2A:
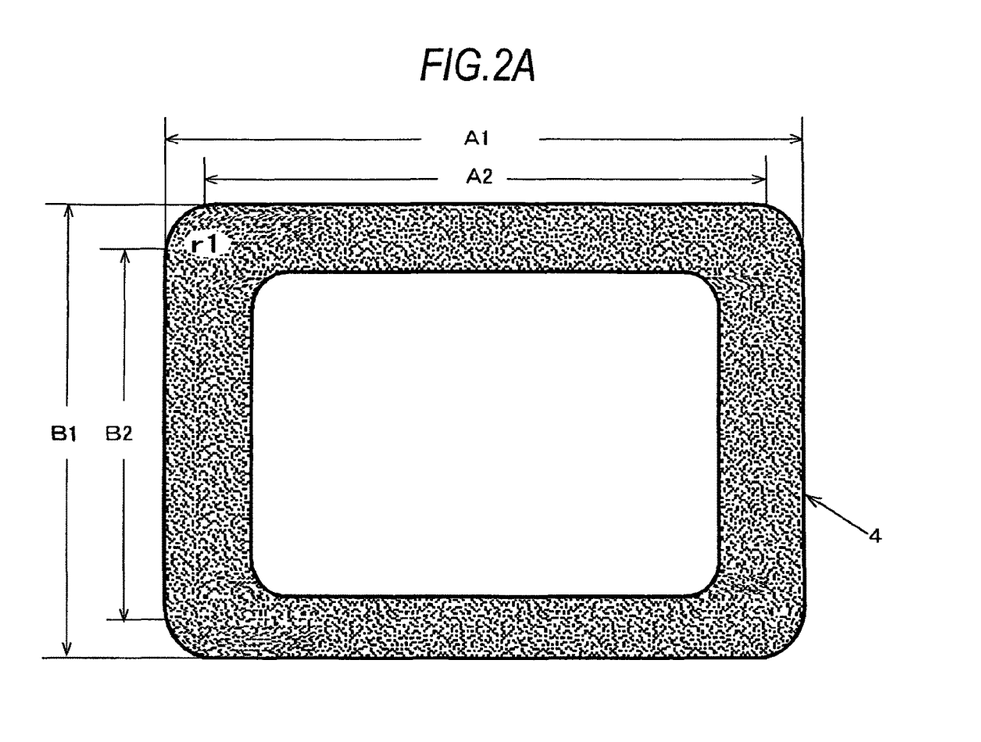
FIG. 2A is a plan view of a metal ring of the surface-mounted unit.
Figure 2B:
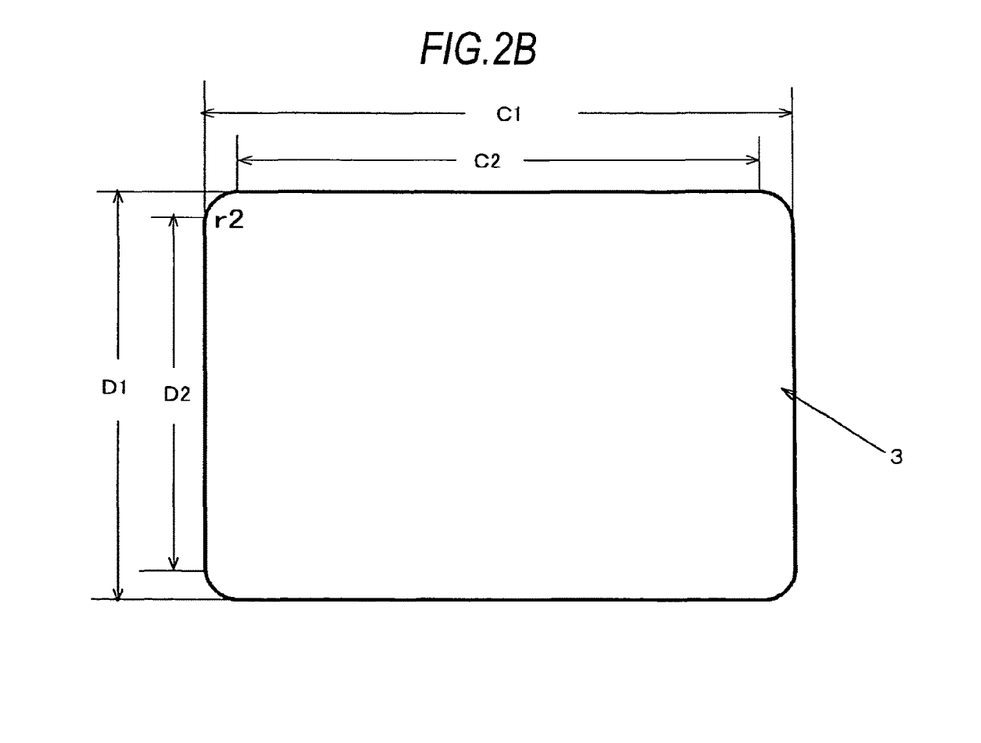
FIG. 2B is a plan view of the metal cover.

FIGS. 1A to 2B are diagrams of a surface-mounted unit for explanation of one embodiment of the invention, in which FIG. 1A is a plan view of the surface-mounted unit to which a metal cover is jointed, FIG. 1B is an enlarged view of a part shown by O-shaped dotted line in FIG. 1A, FIG. 1C is a cross-sectional view of the surface-mounted unit, FIG. 2A is a plan view of a metal ring of the surface-mounted unit, and FIG. 2B is a plan view of the metal cover. Incidentally, portions which are the same as those in the related art are denoted by the same symbols, and descriptions thereof will be simplified or omitted.

A surface-mounted unit 100 according to the invention is configured such that a crystal element 2 is housed in a ceramic case 1, and a metal cover 3 is jointed to a metal ring 4 provided to an end face of an opening by seam welding so as to hermetically encapsulate the crystal element 2. The ceramic case 1 has a rectangular shape in a plan view, which cross section including a bottom wall 1a and a frame wall 1b is formed to be concave. The metal ring 4 is fixed to the end face of the opening (the upper surface of the frame wall 1b) of the ceramic case 1 by, for example, silver solder (not shown) (refer to FIG. 1C).

In this case, where the planar outline of the ceramic case 1 serving as the surface-mounted unit 100 is 2.0×1.6 mm described above, and a width of the frame wall at a long side is 0.235 mm, and a width of the frame wall at a short side is 0.245 mm. The metal ring 4 has a planar outline which is smaller than the ceramic case, that is 1.91×1.51 mm. Then, the metal ring 4 is configured such that a frame width w of a long side of the metal ring 4 is 0.175 mm, and a frame width d of a short side is 0.165 mm, and has arc-formed curved portions with a radius of curvature r1 at outer circumference four corners thereof.

A length A1 of a long side of the metal ring 4 is set to 1.91 mm, and a length A2 of a straight portion except for curved portions on the both sides is set to 1.58 mm, and a ratio A2/A1 of the both comes to 0.83. A length B1 of a short side of the metal ring 4 is set to 1.51 mm, and a length B2 of a straight portion thereof is set to 1.16 mm, and a ratio B2/B1 of the both comes to 0.77. Then, a radius of curvature rl of the outer circumference four corners of the metal ring 4 is set to 0.2 mm.

The metal cover 3 is formed to be 1.81×1.41 mm, that is smaller than the outline of the metal ring 4, and has arc-formed curved portions with a radius of curvature r2 at the outer circumference four corners. A length Cl of a long side of the metal cover 3 is set to 1.81 mm, and a length C2 of the straight portion except for the curved portions on the both sides is set to 1.51 mm, and a ratio C2/C1 of the both comes to 0.84. A length D1 of a short side of the metal cover 3 is set to 1.41 mm, and a length D2 of a straight portion thereof is set to 1.11 mm, and a ratio D2/D1 of the both comes to 0.78. Then, a radius of curvature r2 of the outer circumference four corners of the metal cover 3 is set to 0.15 mm.

That is, in this embodiment, the metal cover 3 is formed into, not a similar shape as in the related art, but a shape which is not similar to the shape of the metal ring 4. That is, the ratios C2/C1 and D2/D1 between the lengths C1 and D1 of a long side and a short side of the metal cover 3 and the lengths C2 and D2 of the respective straight portions are made greater than the ratios A2/A1 and B2/B1 of the lengths A1 and B1 of a long side and a short side of the metal ring 4 and the lengths A2 and B2 of the respective straight portions (A2/A1<C2/C1, B2/B1<D2/D1). Then, the radius of curvature r2 of the metal cover 3 is made smaller than the radius of curvature r1 of the metal ring 4 (r2<r1).

In accordance with such a configuration, the lengths of the straight portions C1 and D1 of a long side and a short side of the metal cover 3 are made longer than that of the related art, and the lengths of the curved portions are shortened. Therefore, when the electrode rollers are made to contact the one set of long sides and the other set of short sides facing each other of the metal cover 3 to travel straight, the electrode rollers come close to contact the virtual both ends of the respective sides.

Accordingly, fusion of the Ni film by welding current can be caused even in the outer circumference four corners which are formed into circular arc forms. Thus, it becomes easy to joint the metal cover 3 to the metal ring 4 even with its outer circumference four corners. Thereby, the sealing paths L due to the fusion of the Ni film on the outer circumference four corners can be ensured. Then, an allowable range for welding current can be relaxed, and productivity of the surface-mounted unit 100 can be improved.

Figure 3:
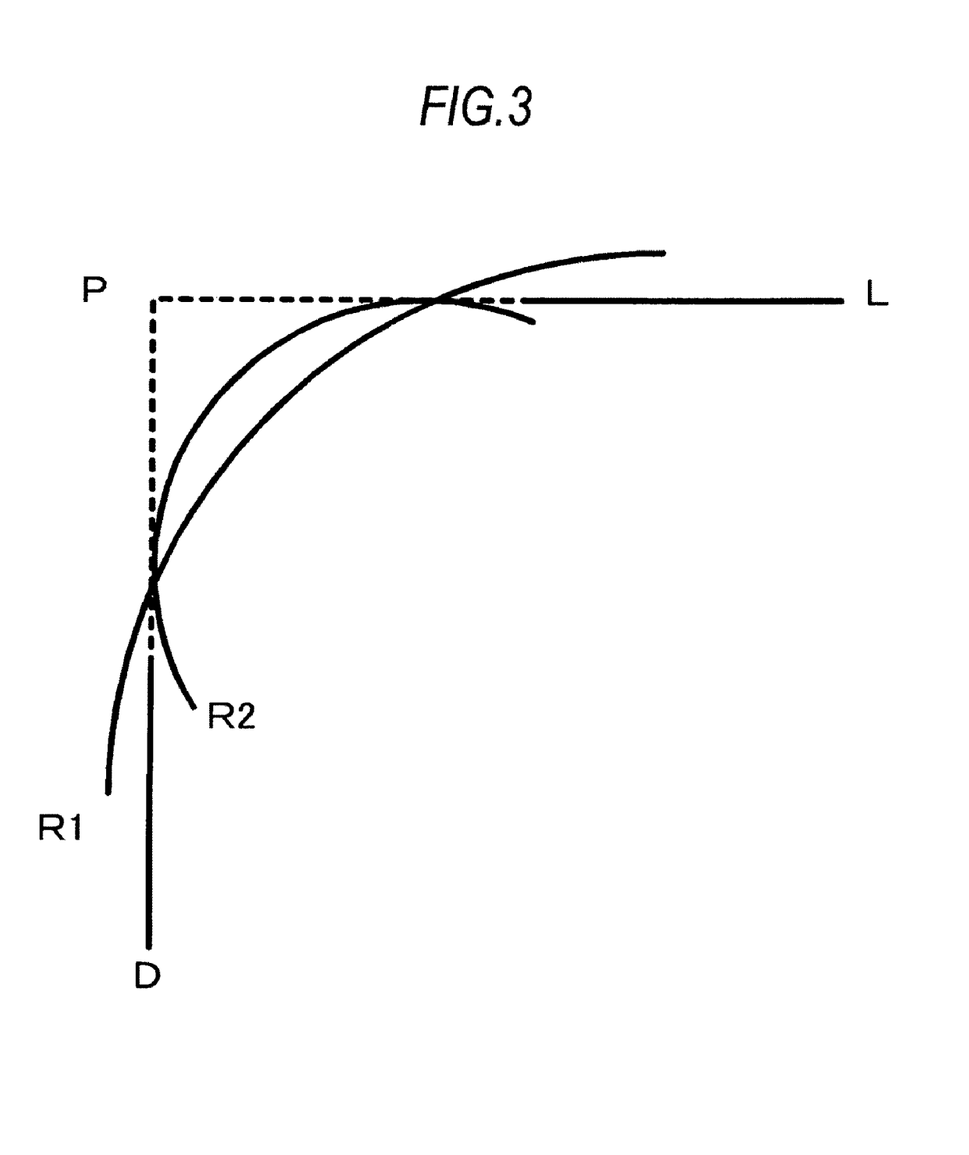
FIG. 3 is a schematic geometric view for explanation of an action of the embodiment of the invention.

Then, in this embodiment, the radius of curvature r2 on the outer circumference four corners of the metal cover 3 is made smaller than the radius of curvature r1 on the outer circumference four corners of the metal ring 4. Accordingly, as schematically shown in FIG. 3, as the leading end of a curved line from a straight portion between a long side L and a short side D of one of the outer circumference four corners, a curved line R2 with a smaller radius of curvature comes closer to a virtual angle P than a curved line R1 with a greater radius of curvature.

Figure 4:
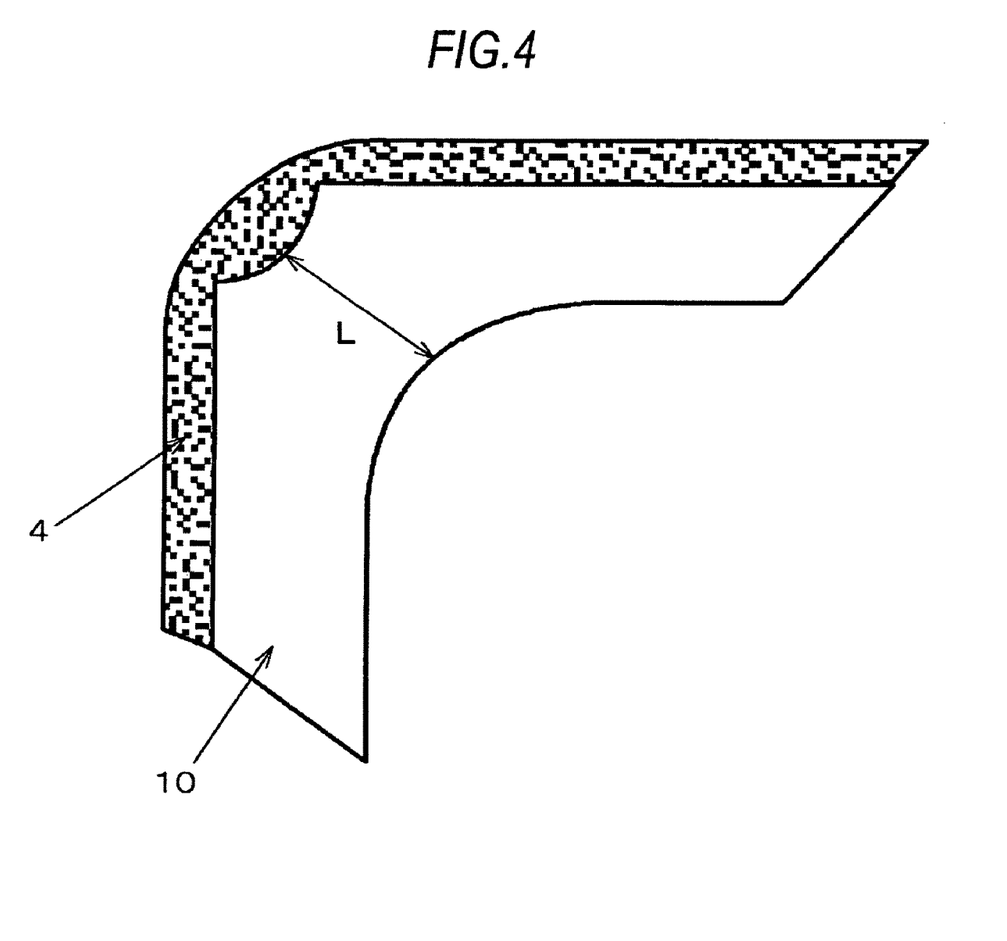
FIG. 4 is an enlarged partial view of the metal ring for explanation of an action of the invention.

Accordingly, even if the electron rollers do not contact the outer circumference four corners, which are formed into circular arc forms, of the metal cover 3, to generate unwelded portions as shown in FIG. 4, unwelded areas are made less. Thereby, further, the welding on the outer circumference four corners is sufficiently performed, which makes it possible to ensure the sealing path L.

Figure 5:
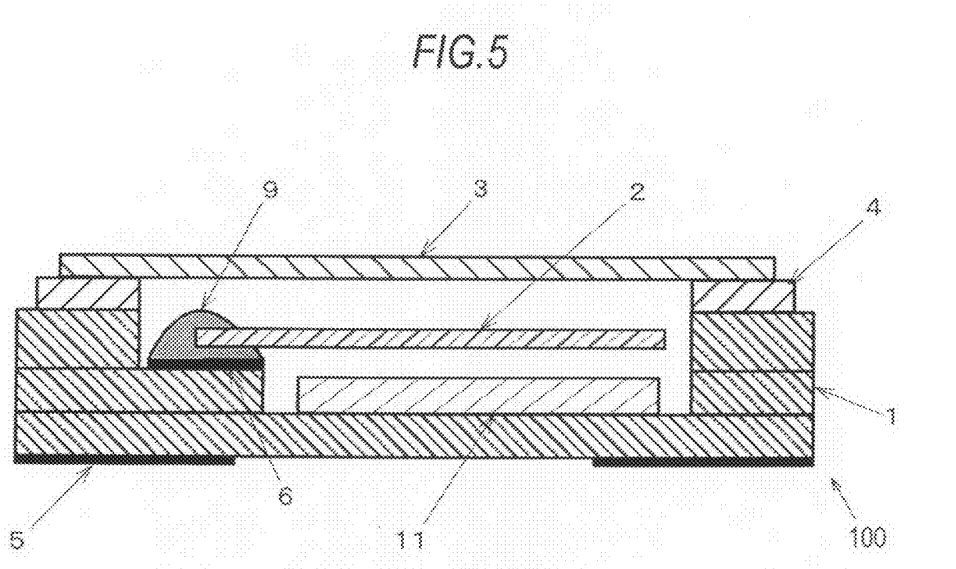
FIG. 5 is a cross-sectional view of a surface-mounted oscillator for explanation of another example to which the invention is applied.

In the above-described embodiment, the surface-mounted unit 100 has been explained as an example. For example, as shown in FIG. 5, the above-described embodiment can be applied in the same way to a case in which an inner wall shoulder is provided to the concave portion of the ceramic case 1, and the both sides of the one end of the crystal element 2 are fixed thereto, and an IC chip 11 is fixed to the inner bottom face of the ceramic case 1 by, for example, flip-chip bonding, to form a surface-mounted oscillator. That is, the above-described embodiment can be applied in the same way to any crystal device for surface mounting in which at least the crystal element 2 is housed.

What is claimed is:

1. A crystal device for surface mounting configured such that:

at least a crystal element is housed in a ceramic case, which has a rectangular shape in a plan view, and which cross section including a bottom wall and a frame wall is formed to be concave; and a metal cover, which is smaller than an outline of a metal ring, and outer circumference four corners of which are formed into arc-formed curved portions with a radius of curvature r2, is jointed to the metal ring, which is provided to an end face of an opening of the ceramic case, and outer circumference four corners of which are formed into arc-formed curved portions with a radius of curvature r1, by seam welding, wherein the crystal device for surface mounting satisfies relationships A2/A1<C2/C1 and B2/B1<D2/D1, where a ratio between a length A1 of a long side of the metal ring and a length A2 of a straight portion of the long side except for the curved portions of the outer circumference four corners of the metal ring is A2/A1, and a ratio between a length B1 of a short side of the metal ring and a length B2 of a straight portion of the short side except for the curved portions of the outer circumference four corners of the metal ring is B2/B1, and where a ratio between a length C1 of a long side of the metal cover and a length C2 of a straight portion of the long side except for the curved portions of the outer circumference four corners of the metal cover is C2/C1, and a ratio between a length D1 of a short side of the metal cover and a length D2 of a straight portion of the short side except for the curved portions of the outer circumference four corners of the metal cover is D2/D1.

2. The crystal device for surface mounting according to claim 1, wherein the radius of curvature r2 of the outer circumference four corners of the metal cover is smaller than the radius of curvature r1 of the outer circumference four corners of the metal ring.

* * * * *